(12) United States Patent
Tong et al.

(10) Patent No.: US 11,863,934 B2
(45) Date of Patent: Jan. 2, 2024

(54) MEMS MICROPHONE

(71) Applicant: AAC Kaitai Technologies (Wuhan) CO., LTD, Hubei (CN)

(72) Inventors: Bei Tong, Shenzhen (CN); Rui Zhang, Shenzhen (CN)

(73) Assignee: AAC KAITAI TECHNOLOGIES (WUHAN) CO., LTD, Wuhan (CN)

( * ) Notice: Subject to any disclaimer, the term of this patent is extended or adjusted under 35 U.S.C. 154(b) by 0 days.

(21) Appl. No.: 17/827,813

(22) Filed: May 30, 2022

(65) Prior Publication Data
US 2023/0217191 A1    Jul. 6, 2023

(30) Foreign Application Priority Data

Dec. 31, 2021    (CN) .......................... 202123452788.4

(51) Int. Cl.
*H04R 19/02*    (2006.01)
*H04R 7/04*    (2006.01)
*H04R 7/18*    (2006.01)
*B81B 3/00*    (2006.01)

(52) U.S. Cl.
CPC ........... *H04R 19/02* (2013.01); *B81B 3/0037* (2013.01); *H04R 7/04* (2013.01); *H04R 7/18* (2013.01); *B81B 2201/0257* (2013.01); *B81B 2203/019* (2013.01); *B81B 2203/0127* (2013.01); *B81B 2203/0163* (2013.01); *H04R 2201/003* (2013.01)

(58) Field of Classification Search
CPC . H04R 19/02; H04R 7/04; H04R 7/18; H04R 2201/003; B81B 3/0037; B81B 2201/0257

See application file for complete search history.

(56) References Cited

U.S. PATENT DOCUMENTS

2010/0084721 A1*    4/2010    Wu ........................ B81B 3/0072
                                                                257/E29.324

FOREIGN PATENT DOCUMENTS

WO    WO-2013011114 A2 *    1/2013    ........... B81B 3/0051

* cited by examiner

*Primary Examiner* — Sunita Joshi
(74) *Attorney, Agent, or Firm* — W&G Law Group

(57) ABSTRACT

The present invention provides a MEMS microphone, including a substrate and a capacitive structure. The capacitive structure includes a back plate and a vibration diaphragm. The vibration diaphragm includes a main body and a plurality of supporting structures for supporting the main body. Each supporting structure includes a supporting beam and two spring structures. Each spring structure includes at least two beam arms extending along the extension direction of the peripheral edge of the main body, and the beam arm closest to the main body is spaced apart from the main body. The sensitivity of the MEMS microphone in the present invention is higher.

4 Claims, 3 Drawing Sheets

US 11,863,934 B2

MEMS MICROPHONE

FIELD OF THE PRESENT DISCLOSURE

The present invention relates to electro-acoustic transducers, and more particularly to a MEMS (Micro-Electro-Mechanical Systems) microphone.

DESCRIPTION OF RELATED ART

A MEMS microphone of the related art includes a substrate and a capacitive structure arranged on the substrate, and the capacitive structure includes a back plate and a vibration diaphragm spaced apart from the back plate. Wherein, the vibration diaphragm includes a main body, and several supporting beams connecting the substrate and the main body. Since the width of the supporting beam is generally wider (>30 μm) and fixed to the substrate, the vibration diaphragm produces a deformation with a large displacement of the main body and a small displacement of the supporting beam under the action of the external sound pressure. It is difficult for the vibration diaphragm to have a large deformation under the action of the external sound pressure, which also limits the sensitivity improvement of the MEMS microphone.

Therefore, it is necessary to provide a new MEMS microphone to solve the technical problems.

SUMMARY OF THE PRESENT INVENTION

The main purpose of the present invention is to provide a MEMS microphone with higher sensitivity.

Accordingly, the present invention provides a MEMS microphone, comprising: a substrate; a capacitive structure disposed on the substrate, including a back plate and a vibration diaphragm spaced from the back plate, the vibration diaphragm including a main body and a plurality of supporting structures extending from a peripheral edge of the main body for supporting the main body; wherein each of the supporting structures includes a supporting beam fixed to the substrate and spaced from the main body; two spring structures symmetrically arranged on both sides of the supporting beam and connecting the supporting beam and the main body respectively; and each spring structure includes at least two zigzag-shaped beam arms extending along an extension direction of the peripheral edge of the main body; and a closest part of the beam arm is spaced apart from the main body.

In addition, an amount of the supporting structures is at least 4, and the supporting structures are evenly spaced apart from each other and arranged on the peripheral edge of the main body.

In addition, a width of each beam arm is at least 3 μm.

In addition, a length of each beam arm is at least 5 μm.

In addition, the vibration diaphragm further comprises an edge part disposed on an outer side of the main body and fixed to the substrate; the edge part and the main body are spaced apart from each other and are both located between two adjacent supporting structures.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

The present disclosure will hereinafter be described in detail with reference to an exemplary embodiment. To make the technical problems to be solved, technical solutions and beneficial effects of the present disclosure more apparent, the present disclosure is described in further detail together with the figures and the embodiment. It should be understood the specific embodiment described hereby is only to explain the disclosure, not intended to limit the disclosure.

Figure 1:
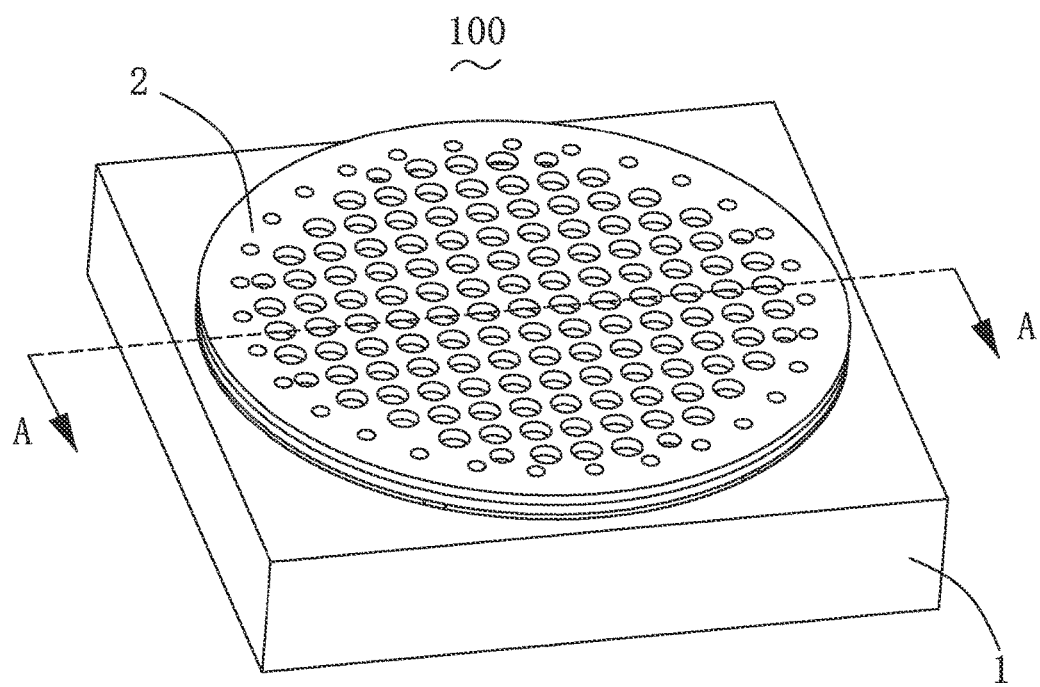
FIG. 1 is an isometric view of a MEMS microphone in accordance with an exemplary embodiment of the present invention.
Figure 2:
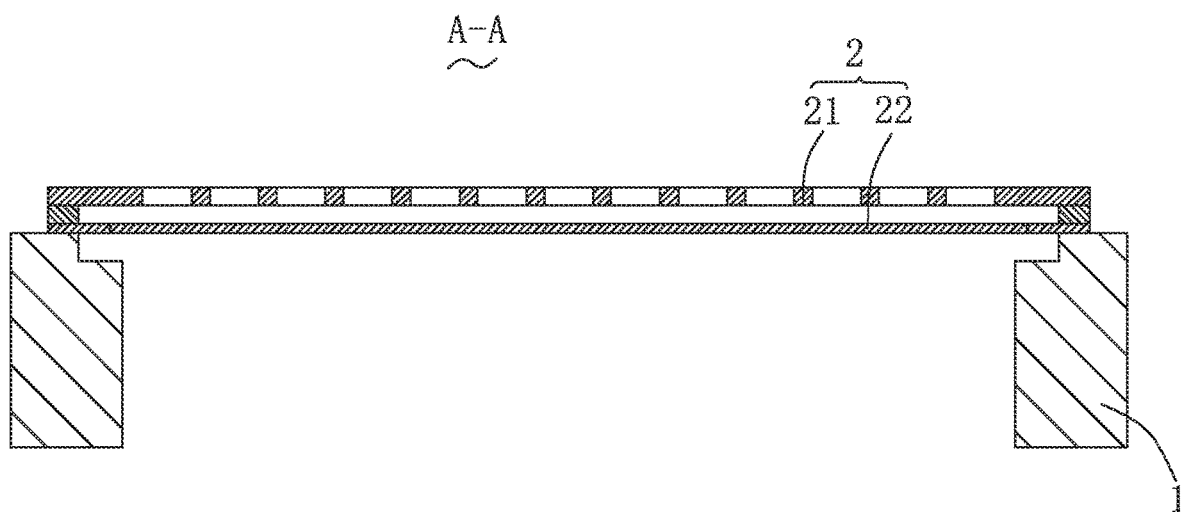
FIG. 2 is a cross-sectional view of the MEMS microphone taken along Line AA in FIG. 1.
Figure 3:
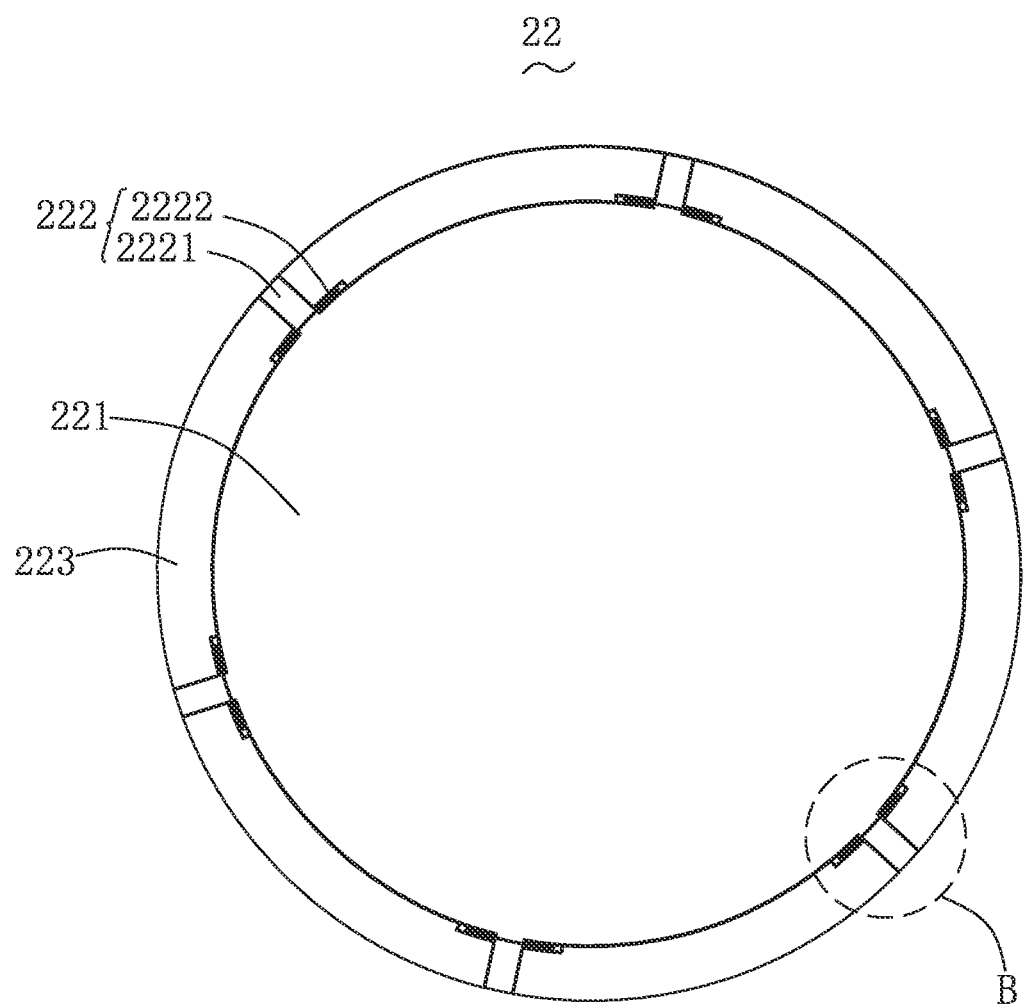
FIG. 3 is an isometric view of a vibration diaphragm of the MEMS microphone of the present invention.
Figure 4:
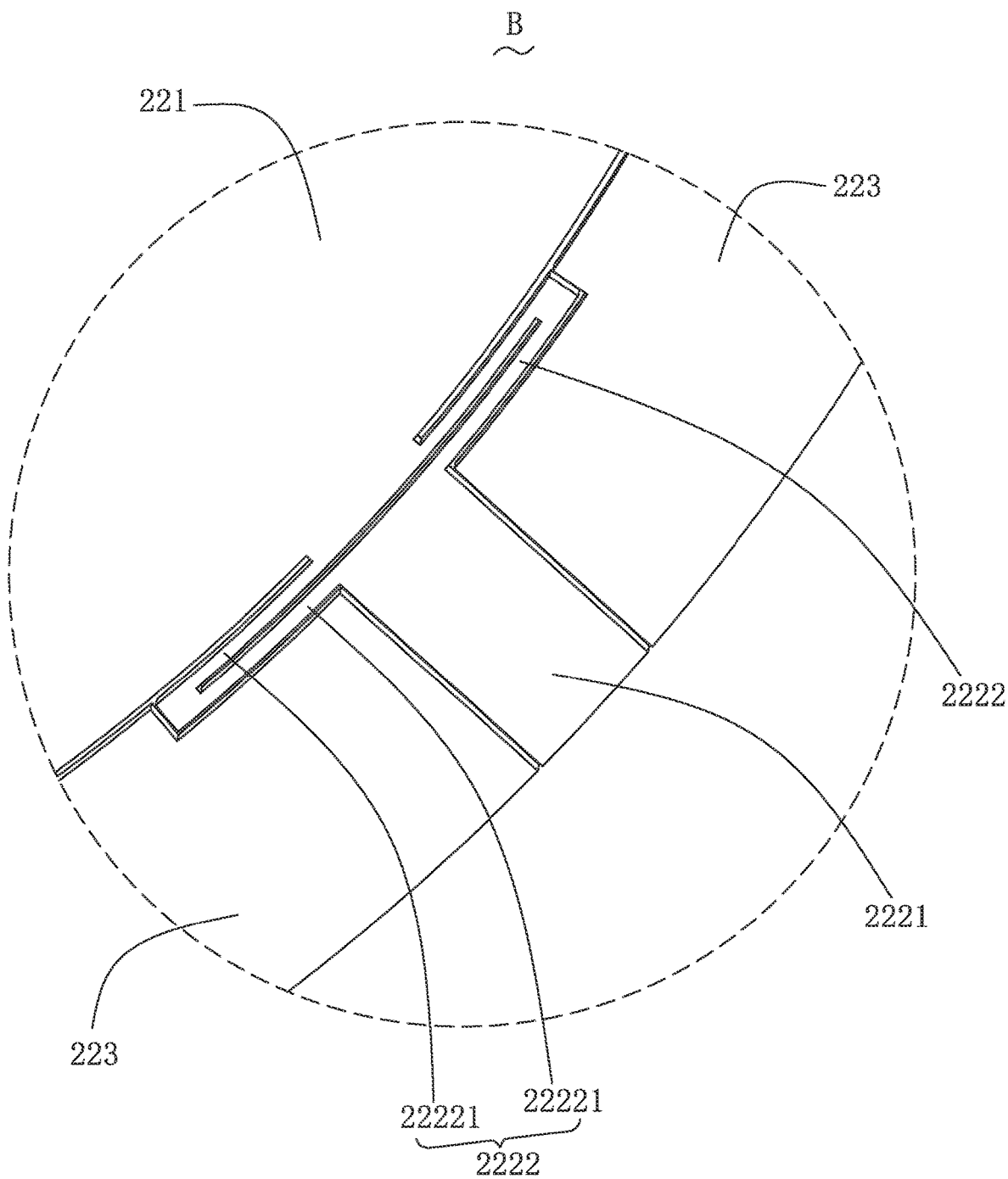
FIG. 4 is a partially enlarged view of Part B in FIG. 3.

Please refer to FIGS. 1-4. A MEMS microphone 100 includes a substrate 1 and a capacitive structure 2 set on the substrate 1.

The capacitive structure 2 includes a back plate 21 and a vibration diaphragm 22 spaced from the back plate 21.

The vibration diaphragm 22 includes a main body 221 and a plurality of supporting structures 222 arranged on the peripheral edge of the main body 221 to support the main body 221, each supporting structure 222 includes a supporting beam 2221 fixed to the substrate 1 and spaced apart from the main body 221, and two spring structures 2222 which are symmetrically arranged on both sides of the supporting beam 2221 and connect the supporting beam 2221 and the main body 221 respectively. Each spring structure 2222 includes at least two beam arms 22221 spaced apart extending along the extension direction of the peripheral edge of the main body 221 and forming back and forth bending. The beam arm 22221 closest to the main body 221 is spaced apart from the main body 221.

Preferably, the number of the supporting structures 222 is at least four. Further, at least four supporting structures 222 are evenly arranged on the peripheral edge of the main body 221 spaced apart from each other. In this embodiment, the number of the supporting structures 222 is six.

In order to ensure that the beam arm 22221 will not break, the width of each beam arm 22221 should be at least 3 μm, the so-called width is the length of the beam arm 22221 along the radial direction of the vibration diaphragm. At the same time, in order to ensure that the spring structure 2222 can better reduce the rigidity of at supporting beam 2221, in addition to 2, 3, 4 or even more beam arms 22221 in each spring structure 2222, the length of each beam arm 22221 should be at least 5 μm. The so-called length is the length of the beam arm 22221 along the extension direction of the peripheral edge of the main body 221.

Preferably, the vibration diaphragm 22 further includes an edge part 223 disposed on the outer side of the main body 221 and fixed to the substrate 1. The edge part 223 is spaced apart from the main body 221, and disposed between two adjacent supporting structures 222 and is spaced apart from each supporting structure 222. The setting of the edge part 223 is beneficial to realize the adjustment of the acoustic resistance of diaphragm by adjusting the width of the interval between the edge part 223 and the main body 221, so as to realize the control of the low frequency characteristic of the FRC curve. In addition, from a process point of view, it is less difficult and more accurate to control the interval between two parts (the main body and the edge part) of same layer (diaphragm layer) than to control the interval between two parts (for example, the diaphragm layer and the substrate) of different layer, and precision is higher.

In the MEMS microphone of the present invention, the vibration diaphragm 22 includes a main body 221 and a plurality of supporting structures 222 arranged on the peripheral edge of the main body 221 to support the main body 221. Each supporting structure 222 includes a supporting beam 2221 fixed to the substrate 1 and spaced from the main body 221, and two spring structures 2222 symmetrically disposed on both sides of the supporting beam 2221 and connecting the supporting beam 2221 and the main body 221 respectively. Each spring structure 2222 includes at least two beam arms 22221 spaced apart extending along the extension direction of the peripheral edge of the main body 221 and forming back and forth bending. The beam arm 22221 closest to the main body 221 is spaced apart from the main body 221. The spring structure 2222 makes the rigidity at the supporting beam 2221 smaller, so that the vibration diaphragm 22 has a larger deformation amount under the same external sound pressure, which improves the sensitivity.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS microphone, comprising:
a substrate;
a capacitive structure disposed on the substrate, including a back plate and a vibration diaphragm spaced from the back plate, the vibration diaphragm including a main body, a plurality of supporting structures extending from a peripheral edge of the main body for supporting the main body, and an edge part disposed on an outer side of the main body and fixed to the substrate, the edge part and the main body spaced apart from each other and both located between two adjacent supporting structures; wherein
each of the supporting structures includes
a supporting beam fixed to the substrate and spaced from the main body;
two spring structures symmetrically arranged on both sides of the supporting beam and connecting the supporting beam and the main body respectively; and
each spring structure includes at least two zigzag-shaped beam arms extending along an extension direction of the peripheral edge of the main body; and a closest part of the beam arm is spaced apart from the main body.

2. The MEMS microphone as described in claim 1, wherein an amount of the supporting structures is at least 4, and the supporting structures are evenly spaced apart from each other and arranged on the peripheral edge of the main body.

3. The MEMS microphone as described in claim 1, wherein a width of each beam arm is at least 3 μm.

4. The MEMS microphone as described in claim 1, wherein a length of each beam arm is at least 5 μm.

* * * * *